(12) United States Patent
Lum et al.

(10) Patent No.: US 10,276,490 B2
(45) Date of Patent: Apr. 30, 2019

(54) ISOLATION DEVICES WITH FARADAY SHIELDS

(71) Applicant: Avago Technologies International Sales Pte. Limited, Singapore (SG)

(72) Inventors: Richard Lum, Singapore (SG); Chee Mang Wong, Singapore (SG); Chunlei Zhan, Singapore (SG)

(73) Assignee: AVAGO TECHNOLOGIES INTERNATIONAL SALES PTE. LIMITED, Singapore (SG)

( * ) Notice: Subject to any disclaimer, the term of this patent is extended or adjusted under 35 U.S.C. 154(b) by 0 days.

(21) Appl. No.: 15/654,826

(22) Filed: Jul. 20, 2017

(65) Prior Publication Data

US 2019/0027436 A1    Jan. 24, 2019

(51) Int. Cl.
| | |
|---|---|
| *H01L 23/52* | (2006.01) |
| *H01L 23/522* | (2006.01) |
| *H01L 23/60* | (2006.01) |
| *H01L 29/06* | (2006.01) |
| *H01L 29/40* | (2006.01) |
| *H01L 23/552* | (2006.01) |

(52) U.S. Cl.
CPC ........ *H01L 23/5225* (2013.01); *H01L 23/552* (2013.01); *H01L 23/60* (2013.01); *H01L 29/0642* (2013.01); *H01L 29/402* (2013.01)

(58) Field of Classification Search
CPC ... H01L 23/5225; H01L 23/552; H01L 23/60; H01L 29/0642; H01L 29/402
See application file for complete search history.

(56) References Cited

U.S. PATENT DOCUMENTS

| | | | |
|---|---|---|---|
| 3,914,137 A | * 10/1975 | Huffman | ................ H01L 27/15 |
| | | | 148/DIG. 135 |
| 5,629,534 A | 5/1997 | Inuzuka et al. | |
| 6,710,376 B2 | 3/2004 | Worley | |

FOREIGN PATENT DOCUMENTS

JP        2017-011084 A     1/2017

* cited by examiner

*Primary Examiner* — Mark V Prenty
(74) *Attorney, Agent, or Firm* — Sheridan Ross P.C.

(57) ABSTRACT

An isolation device includes a first integrated circuit in electrical communication with first circuitry. The first integrated circuit includes a first light emitter portion to emit a first optical signal based on first electrical signals received at the first integrated circuit from the first circuitry. The isolation device includes a second integrated circuit in electrical communication with second circuitry. The second integrated circuit includes a first light-sensitive area to convert the first optical signal into second electrical signals for communication to the second circuitry. The isolation device includes an isolation material between the first integrated circuit and the second integrated circuit to electrically isolate the first integrated circuit from the second integrated circuit and to pass the first optical signal from the first light emitter portion to the first light-sensitive area. The isolation device includes a first shield to shield the first light emitter portion from electromagnetic radiation.

20 Claims, 10 Drawing Sheets

ISOLATION DEVICES WITH FARADAY SHIELDS

FIELD OF THE DISCLOSURE

Example embodiments are generally directed toward electronic isolation and devices for accommodating the same.

BACKGROUND

There are many types of electrical systems that benefit from electrical isolation. Galvanic isolation is a principle of isolating functional sections of electrical systems to prevent current flow, meaning that no direct electrical conduction path is permitted between different functional sections. As one example, certain types of electronic equipment require that high-voltage components (e.g., 1 kV or greater) interface with low-voltage components (e.g., 10V or lower). Examples of such equipment include medical devices and industrial machines that utilize high-voltage in some parts of the system, but have low-voltage control electronics elsewhere within the system. The interface of the high-voltage and low-voltage sides of the system relies upon the transfer of data via some mechanism other than electrical current.

Other types of electrical systems such as signal and power transmission lines can be subjected to voltage surges by lightning, electrostatic discharge, radio frequency transmissions, switching pulses (spikes), and perturbations in power supply. These types of systems can also benefit from electrical isolation.

Electrical isolation can be achieved with a number of different types of devices. Some examples of isolation products include galvanic isolators, optocouplers, inductive, and capacitive isolators. Previous generations of electronic isolators used two chips in a horizontal configuration with wire bonds between the chips. These wire bonds provided a coupling point for large excursions in the difference between the grounds of the systems being isolated. These excursions can be on the order of 25,000 V/usec.

As mentioned above, electrical isolation can be achieved with capacitive, inductive isolators, optical, and/or RF isolators to transmit data across an isolation boundary. There is a desire to add more optical channels to optical couplers in an attempt to meet the complex functionality requirements for various applications. However, there are concerns with respect to chip space utilization and chip pin utilization. Simply adding more channels to an optical coupler will increase package size and/or pin counts, which translates to a larger footprint on a Printed Circuit Board (PCB), which is generally undesirable in end products. It is a challenge to incorporate additional features into an existing number of channels already established in an optocoupler package.

BRIEF DESCRIPTION OF THE DRAWINGS

Inventive concepts are described in conjunction with the appended figures, which are not necessarily drawn to scale.

DETAILED DESCRIPTION

Figure 1:
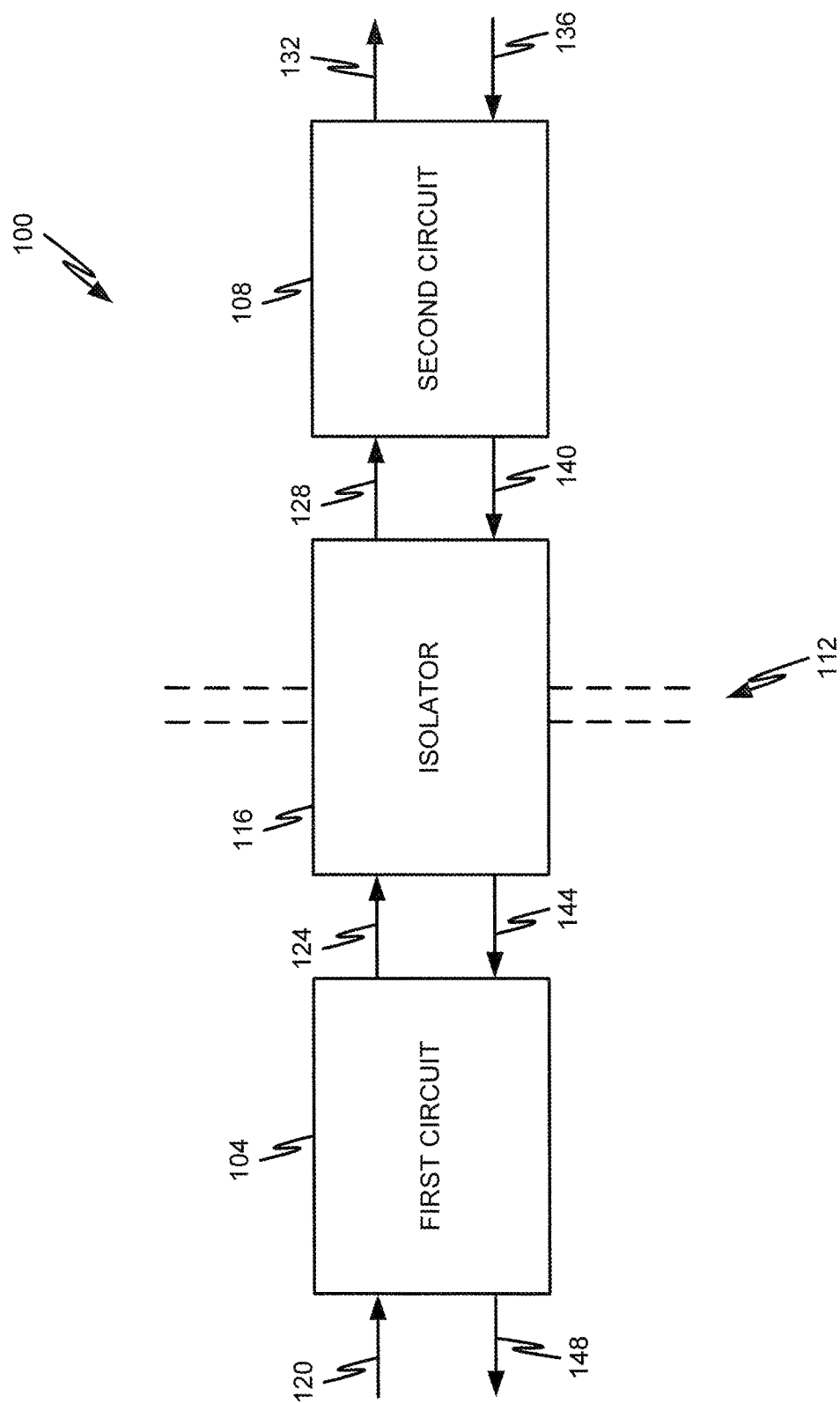
FIG. 1 is a schematic block diagram depicting an isolation system according to at least one example embodiment.

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

Various aspects of example embodiments will be described herein with reference to drawings that are schematic illustrations of idealized configurations. As such, variations from the shapes of the illustrations as a result, for example, manufacturing techniques and/or tolerances, are to be expected. Thus, the various aspects of example embodiments presented throughout this document should not be construed as limited to the particular shapes of elements (e.g., regions, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes are not intended to illustrate the precise shape of an element and are not intended to limit the scope of example embodiments.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" or "established" on another element, it can be grown, deposited, etched, attached, connected, coupled, or otherwise prepared or fabricated on the other element or an intervening element.

Furthermore, relative terms, such as "lower" or "bottom" and "upper" or "top" may be used herein to describe one element's relationship to another element as illustrated in the drawings. It will be understood that relative terms are intended to encompass different orientations of an apparatus in addition to the orientation depicted in the drawings. By way of example, if an apparatus in the drawings is turned over, elements described as being on the "lower" side of other elements would then be oriented on the "upper" side of the other elements. The term "lower" can, therefore, encompass both an orientation of "lower" and "upper" depending of the particular orientation of the apparatus. Similarly, if an apparatus in the drawing is turned over, elements described as "below" or "beneath" other elements would then be oriented "above" the other elements. The terms "below" or "beneath" can therefore encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

As used herein, the singular forms "a," "an," and "the" are intended to include the plural forms as well, unless the context clearly indicates otherwise. It will be further understood that the terms "include," "includes," "including," "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

Referring now to FIGS. 1-10, various configurations of isolation systems, isolators, and isolation devices are depicted and described. In some embodiments, the isolators described herein may be incorporated into any system which requires current and/or voltage monitoring, but is susceptible to transients. In some embodiments, the isolation system in which an isolator described herein is rated to operate at about 5 kV, 10 kV, or more. Stated another way, the input side (e.g., a high-voltage side) of the isolator or isolation system may be directly connected to a 5 kV, 10 kV, 15 kV or greater source without damaging the isolator or any electronic devices attached to the output side (e.g., a low-voltage side) of the isolator. Accordingly, an isolation system which employs one or more of the isolators disclosed herein may be configured to operate in high-voltage or high-current systems but may also be configured to separate the high-voltage or high-current systems from a low-voltage or low-current system.

Referring now to FIG. 1, an isolation system 100 will be described in accordance with at least one example embodiment. The system 100 is shown to include a first circuit (or first circuitry) 104 and second circuit (or second circuitry) 108 separated by an isolation boundary 112. In some embodiments, an isolator 116 may provide a mechanism for carrying communication signals across the isolation boundary 112.

The first circuit 104 may be operating in a high-voltage environment (e.g., with a ground potential at or exceeding 1 kV) whereas the second circuit 108 may be operating in a low-voltage environment (e.g., with a ground potential below 100V). Of course, the opposite condition may also be true without departing from the scope of example embodiments. The isolation boundary 112 may provide the mechanism for protecting the low-voltage environment from the high-voltage environment. The isolator 116 may be configured to establish and maintain the isolation boundary 112 while simultaneously facilitating the exchange of communications from the first circuit 104 to the second circuit 108 and vice versa. It should be appreciated, however, that the second circuit 108 may be operating in the high-voltage environment and the first circuit 104 may be operating in the low-voltage environment.

In some embodiments, the first circuit 104 receives a first input signal 120 at a first voltage (e.g., a high voltage). The first circuit 104 outputs a first output signal 124 to the isolator 116. The first output signal 124 is still at the same nominal voltage as the first input signal 120. The isolator 116 communicates information from the first output signal 124 to the second circuit 108 via a second input signal 128. The second input signal 128 is now a second voltage (e.g., a low voltage) by operation of the isolator 116. The second circuit 108 then processes the second input signal 128 and generates a second output signal 132 that is communicated to additional circuitry or controller components.

Conversely, to facilitate a bi-directional flow of information across the isolation boundary 112, a third input signal 136 may be received at the second circuit 108. The second circuit 108 may generate a third output signal 140 based on the third input signal 136. The third output signal 140 may be provided to the isolator 116. In some embodiments, the third output signal 140 is nominally at a similar voltage to the second input signal 128. The isolator 116 may operate on the third output signal 140 in a similar fashion to the way that the first output signal 124 is processed, except in reverse. Specifically, the isolator 116 may produce a fourth input signal 144 that carries information previously contained in the third output signal 140. The fourth input signal 144 may be nominally at a similar voltage to the first output signal 124. The further input signal 144 may be provided to the first circuit 104, which produces a fourth output signal 148 based on the fourth input signal 144.

Even though the first circuit 104 operates at a different voltage than the second circuit 108 and there is an electrical isolation between the two circuits 104, 108, the isolator 116 is able to preserve the information from the first output signal 124 and communicate that information to the second circuit 108 via the second input signal 128. The second input signal 128 may correspond to a logical representation or copy of the first output signal 124. The second input signal 128 is essentially a reproduction of the first output signal 124 on different circuitry and at a different potential. Likewise, the isolator 116 is able to preserve information from the third output signal 140 and communicate that information to the first circuit 104 via the fourth input signal 144. The fourth input signal 144 is essentially a reproduction of the third output signal 140 on different circuitry and at a different potential. It should be appreciated that the isolator 116 may be designed to carry information across the isolation boundary 112 in two different directions, either sequentially or simultaneously.

The isolation components 204 and 208 are also referred to herein as a first integrated circuit (IC) 204 and a second integrated circuit (IC) 208. The isolation boundary 112 is also referred to herein as an isolation material 112. The isolator 116 may also be referred to herein as an isolation device 116.

Figure 2:
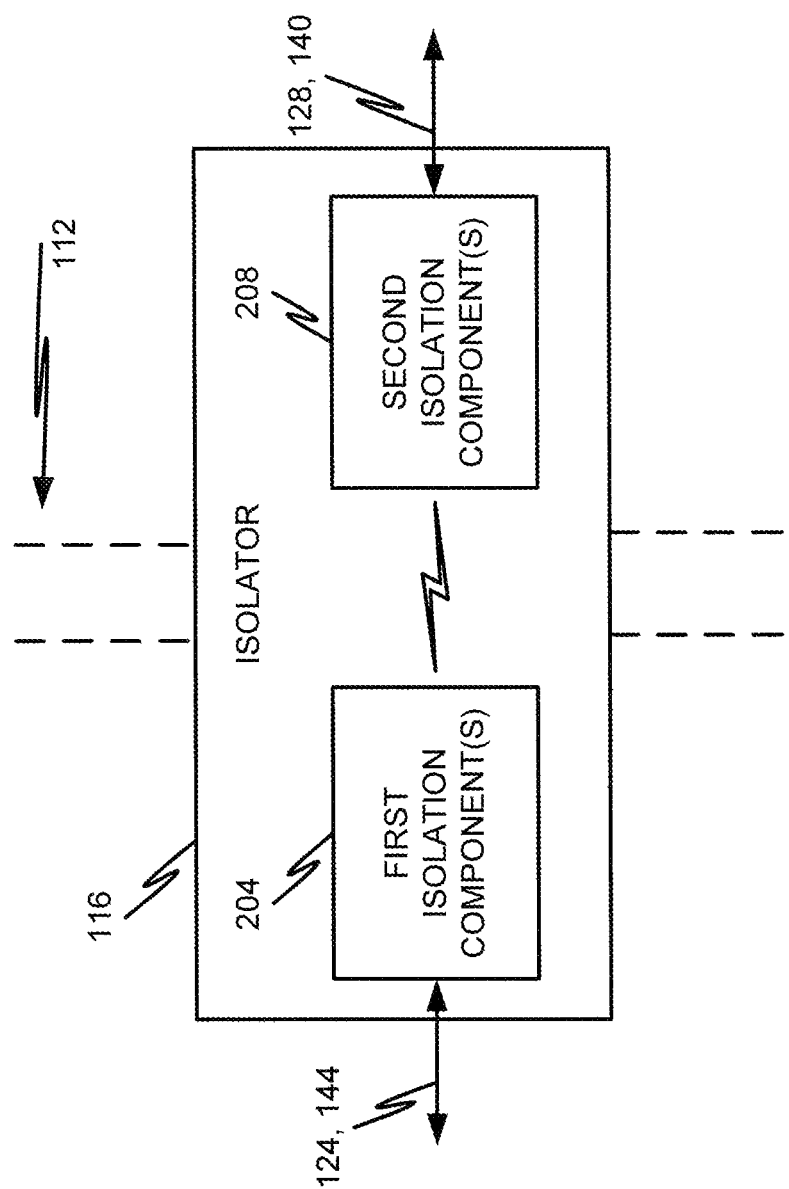
FIG. 2 is a schematic block diagram depicting details of an isolator (or isolation device) according to at least one example embodiment.

With reference now to FIG. 2, additional details of the isolator 116 will be described in accordance with at least one example embodiment. The isolator 116, as discussed above, is responsible for communicating information between the first circuit 104 and second circuit 108 while simultaneously maintaining the isolation boundary 112 between the circuits 104, 108. Communication of the signal 124 across the isolation boundary 112 is achieved by one or more isolation components 204, 208, which may correspond to optical or optoelectronic isolation components as will be discussed in further detail herein.

The isolator 116 may comprise first isolation component(s) 204 on its first side and second isolation component(s) 208 on its second side. The first isolation component(s) 204 and second isolation component(s) 208 may correspond to optoelectronic devices (e.g., LEDs, photodetectors, photodiodes, lasers, etc.) or the like that work together to communicate signals between one another wirelessly, thereby maintaining the isolation boundary 112. In some embodiments, the isolation components 204, 208 communicate with one another via optical coupling (e.g., by the transmission and reception of optical signals in the form of photons). Other coupling techniques such as inductive coupling, magnetic coupling, capacitive coupling, or the like may also be used by isolator 116.

In at least one example embodiment, the first circuitry 104 and the first integrated circuit 204 are connected to a first ground or a first common voltage, and the second circuitry 108 and the second integrated circuit 208 are connected to a second ground or a second common voltage. Further, the isolation device 116 may include a leadframe or printed circuit board that supports both the first integrated circuit 204 and the second integrated circuit 208.

Figure 3:
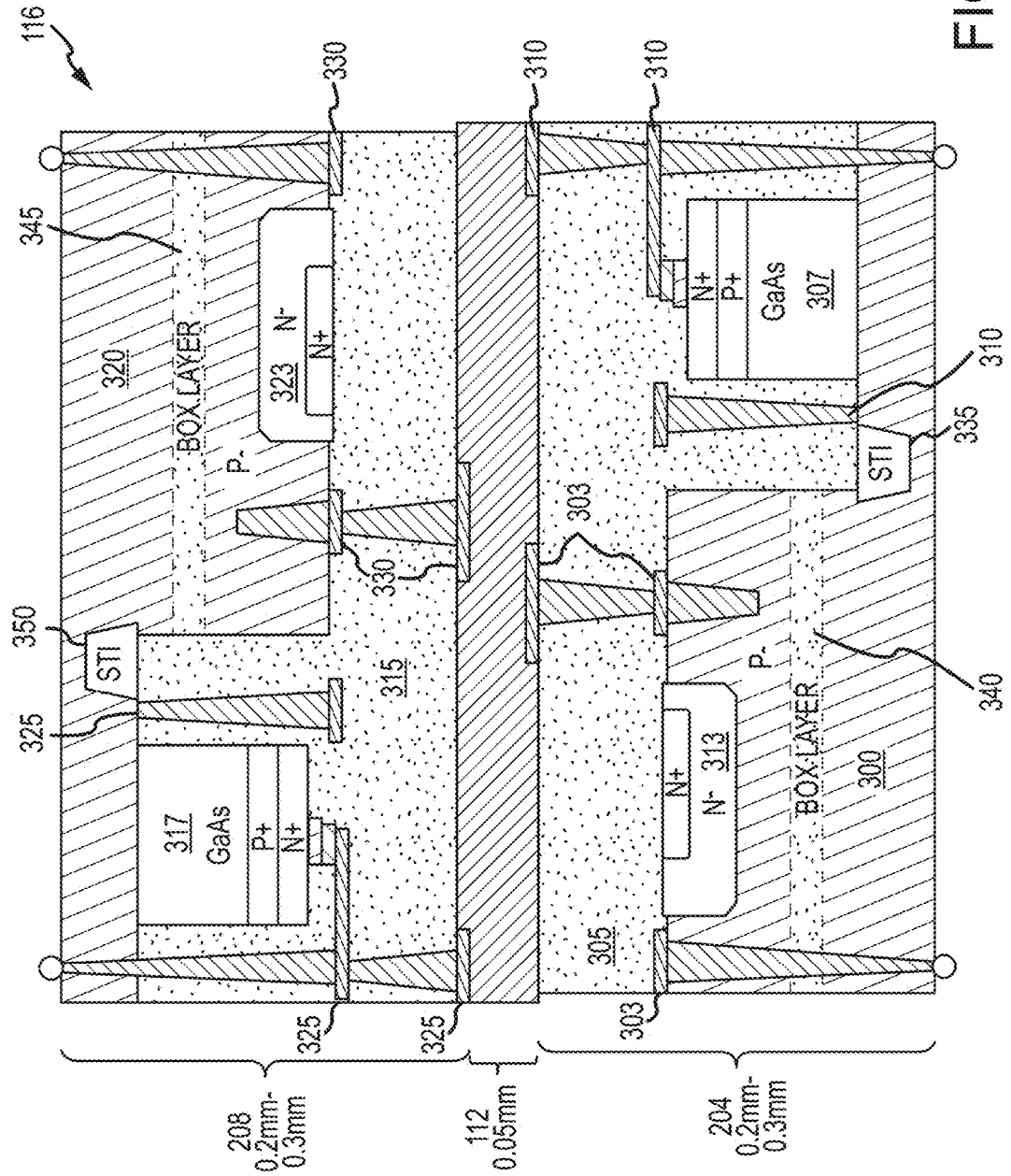
FIG. 3 depicts an example of an isolation device of FIGS. 1 and 2 according to at least one example embodiment.

FIG. 3 depicts an example of an isolation device 116 in accordance with at least one example embodiment. In particular, FIG. 3 illustrates a cross sectional view of the isolation device 116.

With reference to FIGS. 1-3, the isolation device 116 includes a first integrated circuit 204 in electrical communication with first circuitry 104. The first integrated circuit 204 includes a first light emitter portion (or light source) 307 configured to emit a first optical signal based on first electrical signals 124 received at the first integrated circuit 204 from the first circuitry 104. The isolation device 116 includes a second integrated circuit 208 in electrical communication with second circuitry 108. The second integrated circuit 208 includes a first light-sensitive area (or photodetector) 323 configured to convert the first optical signal into second electrical signals 128 for communication to the second circuitry. The isolation device 116 includes an isolation material 112 between the first integrated circuit 204 and the second integrated circuit 208 to electrically isolate the first integrated circuit 204 from the second integrated circuit 208 and to pass the first optical signal from the first light emitter portion 307 to the first light-sensitive area 323. The isolation device 116 includes a first shield (or first electromagnetic shield) 310 to shield the first light emitter portion 307 from electromagnetic radiation.

As shown in FIG. 3, the first integrated circuit 204 further comprises a second light-sensitive area (or photodetector) 313 and the second integrated circuit 208 further comprises a second light emitter portion (or light source) 317. The second integrated circuit 208 includes the second light emitter portion 317 configured to emit a second optical signal based on second electrical signals 140 received at the second integrated circuit 208 from the second circuitry 108. The first integrated circuit 204 includes the second light-sensitive area 313 configured to convert the second optical signal into second electrical signals 144 for communication to the first circuitry 104.

In at least one example embodiment, the first and second light sensitive areas 323/313 comprise one or more light sensors, such as photodiodes, phototransistors, etc. that convert incident light into electrical signals. In at least one example embodiment, the first and second light emitter portions 307/317 comprise light emitting diode (LED) structures. FIG. 3 illustrates an example where the first and second light emitter portions 307/317 comprise LED structures with a base comprised of a semiconductor, such as GaAs, that supports stacked doped regions P+ (e.g., AlGaAs) and N+ (e.g., AlGaAs). The LED structures may be grown onto the substrates 300/320 using a metal-organic chemical vapor deposition (MOCVD) process or the like. Further, the LED structures are not limited to being formed of GaAs and may be formed of any material (e.g., Group III-V material) known in the LED art, such as $Al_xGa_{1-x}As$, GaN, InP, etc.

As shown in FIG. 3, the light emitter portions 307/317 are formed on areas of the substrates 300/320 that are thinner than areas of the substrates 300/320 where the first and second light-sensitive areas 323/313 are formed.

FIG. 3 further illustrates that an N-type material (e.g., doped region N+) of the first light emitter portion 307 is closer to the first light-sensitive area 323 than a P-type material (e.g., doped region P+) of the first light emitter portion 307. Similarly, an N-type material (e.g., doped region N+) of the second light emitter portion 317 is closer to the second light-sensitive area 313 than a P-type material (e.g., doped region P+) of the second light emitter portion 317.

In view of the above, it should be appreciated that the first light-sensitive area 323 and the first light emitter portion 307 establish a first communication channel, and the second light-sensitive area 313 and the second light emitter portion 317 establish a second communication channel. In accordance with example embodiments, the first communication channel and the second communication channel are configured to transmit different data between the first integrated circuit 204 and second integrated circuit 208 via optical signals. For example, the first communication channel carries data via the first optical signal from the first light emitter portion 307 to the first light-sensitive area 323, and the second communication channel carries data via a second optical signal from the second light emitter portion 317 to the second light-sensitive area 313.

As shown in FIG. 3, the second integrated circuit 208 further comprises a second shield 325 to shield the second light emitter portion 317 from electromagnetic radiation. As also shown in FIG. 3, the first light emitter portion 307 and the second light-sensitive area 313 are adjacent to one another in the first integrated circuit 204 such that a portion of the first shield 310 is between the first light emitter portion 307 and the second light-sensitive area 313. Similarly, the first light-sensitive area 323 and the second light emitter portion 317 are adjacent to one another in the second integrated circuit 208 such that a portion of the second shield (or second electromagnetic shield) 325 is between the first light-sensitive area 323 and the second light emitter portion 317. In other words, the first and second shields 310/325 are at least partially embedded in the first integrated circuit 204 and the second integrated circuit 208, respectively, to shield the first and second light emitter portion 310/317 from electromagnetic radiation.

The first integrated circuit 204 includes a buried oxide (BOX) layer 340 while the second integrated circuit includes a BOX layer 345. Layers 340 and 345 may be comprised of $SiO_2$ or other suitable oxide material. Layers 340 and 345 function as an isolator between the light sensitive areas 313/323 and the remainder of the substrates 300/320.

The first integrated circuit 204 includes a third shield (or electromagnetic shield) 303 that shields the second light sensitive area 313 from electromagnetic radiation, and the second integrated circuit 208 includes a fourth shield (or electromagnetic shield) 330 that shields the first light sensitive area 323 from electromagnetic radiation. As shown, the shields 303 and 330 may include one or more conductive vias that connect the light sensitive areas 313/323 to other components in the first and second integrated circuits 204/208. For example, the one or more conductive vias may electrically connect the light sensitive areas 313/323 to the first and second circuitry 104/108, respectively.

The shields 303/310/325/330 may be comprised of Al or other suitable conductive material. For example, the portions of shields 303/310/325/330 that provide interconnect pads between vias may be formed of Al while the vias may be formed of Cu. The first and second shields 310/325 may be embedded in the first and second ICs 204/208 so as to completely surround the sides of respective light emitter portions 307/317 (see FIGS. 5A-5C). Shields 303/330 may be embedded in the first and second ICs 204/208 so as to completely surround the sides of respective light sensitive portions 323/313 (see FIG. 6). In FIG. 3, the shields 303/310/325/330 may extend all the way through the first and second ICs 204/208. However, example embodiments are not limited thereto, and the shields 303/310/325/330 extend only part of the way through first and second ICs 204/208. Alternatively, example embodiments may provide for a combination of shields that extend part of the way through the ICs 204/208 and shields that extend all the way through ICs 204/208.

FIG. 3 further shows that the first and second ICs 204/208 include respective shallow trench isolation regions (STI) 335 and 350 to provide additional isolation within each IC.

Figure 7:
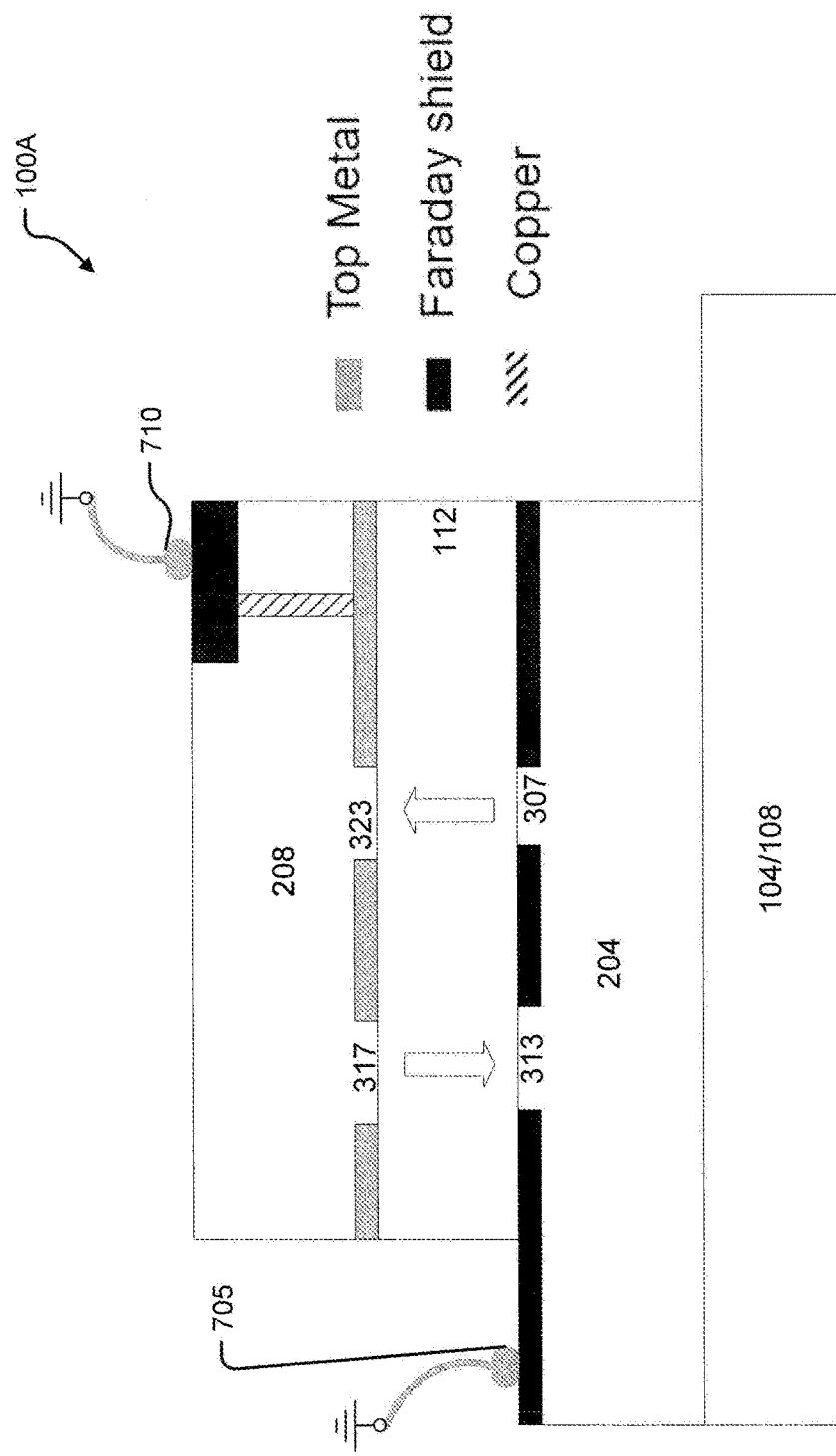
FIG. 7 illustrates an example arrangement of the system in FIG. 1 according to at least one example embodiment.
Figure 8:
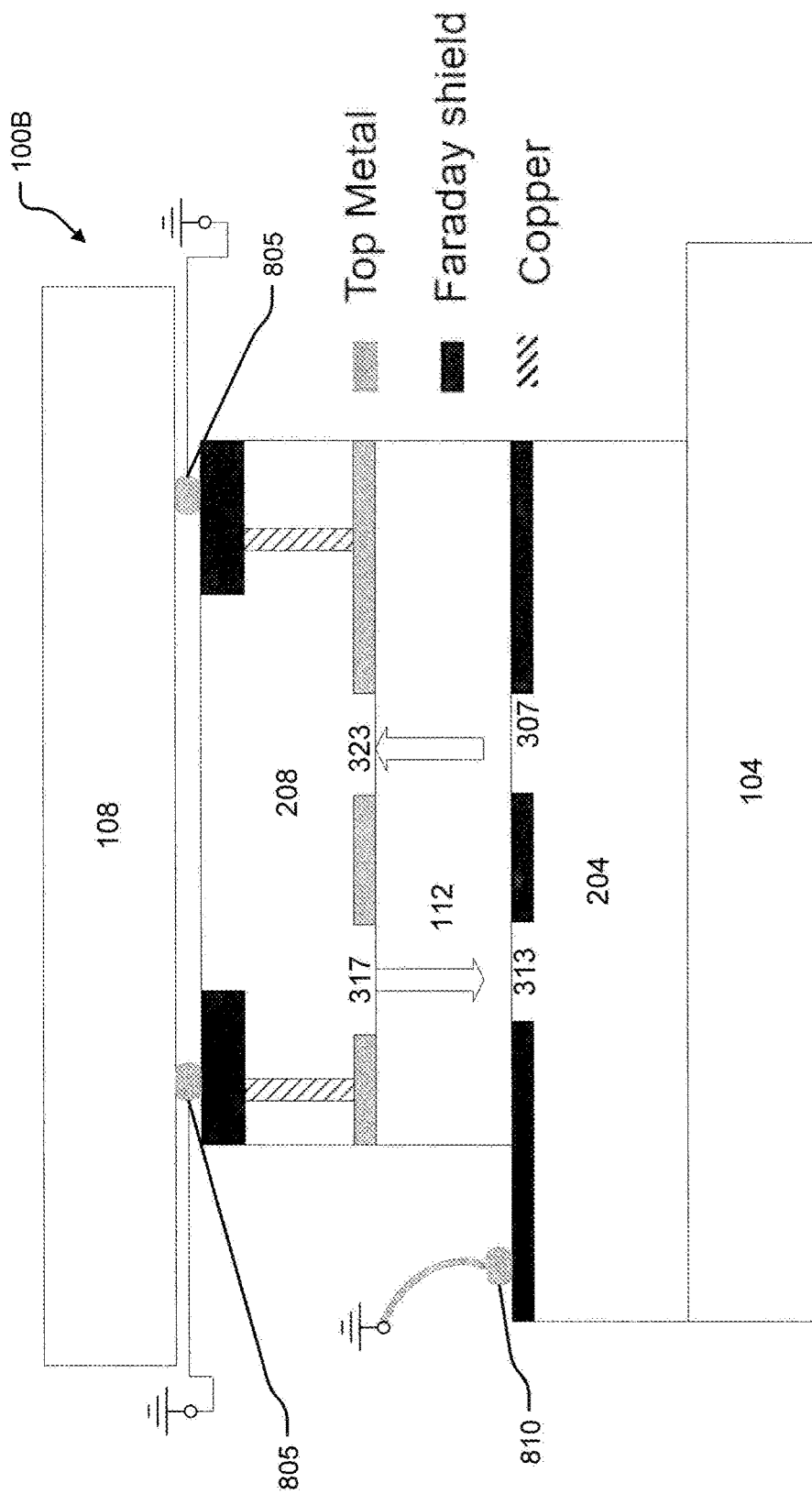
FIG. 8 illustrates another example arrangement of the system in FIG. 1 according to at least one example embodiment.
Figure 9:
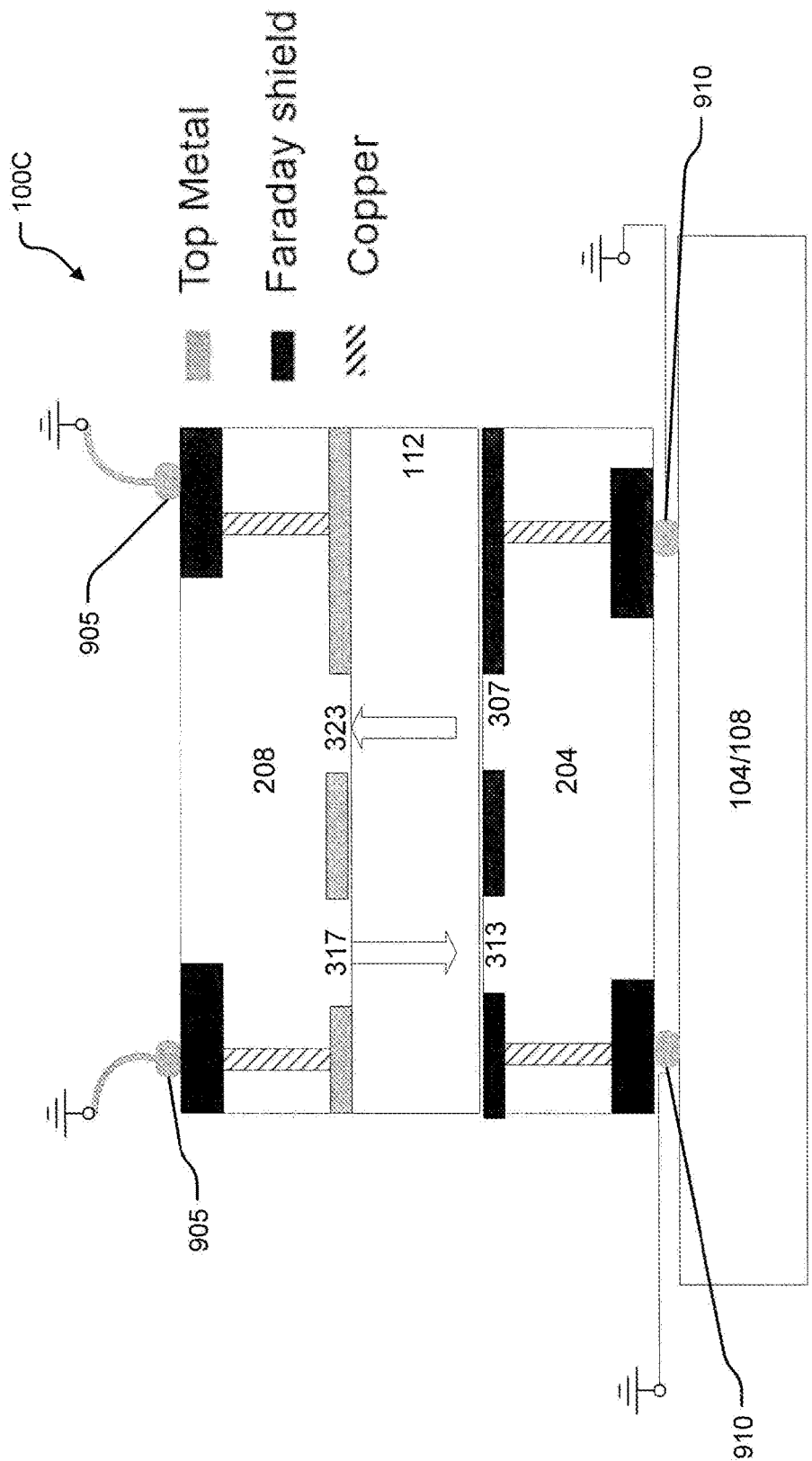
FIG. 9 illustrates an example arrangement of the system in FIG. 1 according to at least one example embodiment.

According to at least one example embodiment, the first shield 310 is grounded thereby establishing a Faraday shield around the first light emitter portion 307, and the second shield 325 is grounded thereby establishing a Faraday shield around the second light emitter portion 317. The third shield 303 is grounded thereby establishing a Faraday shield around the second light-sensitive area 313, and the fourth shield 330 is grounded thereby establishing a Faraday shield around the first light-sensitive area 323. For example, the shields 303/310/325/330 are grounded via solder bumps on back sides of the substrates 300/320 (e.g., if the shields 303/310/325/330 extend all the way through the ICs 204/208). In this case, the solder bumps may comprise respective solder bumps to electrically connect portions of the shields 303/310/325/330 that extend through the ICs 204/208. Although four solder bumps have been discussed, it should be understood that fewer or additional solder bumps may be included according to design preferences. For example, additional solder bumps may be electrically connected to the other portions of the shields 303/310/325/330 that extend through the first and second ICs 204/208. FIGS. 7-9 illustrate examples of using solder bumps to ground shields in more detail.

As shown in FIG. 3, the first and second light sensitive areas 323/313 are formed in substrates 320 and 300, respectively. The substrates 300/320 may be semiconductor substrates comprised of Si (e.g., P-doped silicon) and/or the like. Further, the first and second light emitter portions 307/317 are formed in regions 305 and 315, respectively. The regions 305/315 may be oxide regions comprised of $SiO_2$ and/or the like.

Although the conductive vias shown in FIG. 3 are being formed of multiple intermetal layers, it should be understood that the vias may alternatively be formed as a unitary structure if desired. Further, it should be understood that these vias or intermetal layers include portions that are offset from the light sensitive areas 313/323 in a plan view so that the light sensitive areas 313/323 are able to sense optical signals from the first and second light emitter portions 307/317. The one or more conductive vias and/or intermetal layers lead to one or more conductive contacts (or pads) at boundaries between the first and second integrated circuits 204/208 and the isolation material 112.

As shown in FIG. 3, the isolation material 112 is sandwiched between the first integrated circuit 204 and the second integrated circuit 208. The isolation material 112 may comprise an optically transparent and insulative material that electrically isolates the first and second ICs 204 and 208 but allows optical signals to travel between the first and second ICs 204 and 208. In one example embodiment, the isolation material 112 includes optically transparent and insulative tape, which may assist with adhering the first IC 204 to the second IC 208 in the isolation device 116. In another example embodiment, the isolation material 112 comprises a spun-on polyimide.

FIG. 3 illustrates various example thicknesses of the first IC 204, the second IC 208 and the isolation material 112. In particular, the first IC 204 and the second IC 208 have thicknesses between about 0.2 mm and about 0.3 mm while the isolation material 112 has a thickness of about 0.05 mm. However, example embodiments are not necessarily limited thereto, and the specific thicknesses of the ICs 204/208 and the isolation material 112 may vary according to design preferences. For example, the thicknesses may vary so long as a ratio of thicknesses of the first integrated circuit 204 and the second integrated circuit 208 to a thickness of the isolation material 112 is between about 4:1 and about 6:1. That is, a ratio of a thickness of the first integrated circuit 204 to a thickness of the insulation material 112 to a thickness of the second integrated circuit 208 is about 4:1:4 to about 6:1:6.

Figure 4:
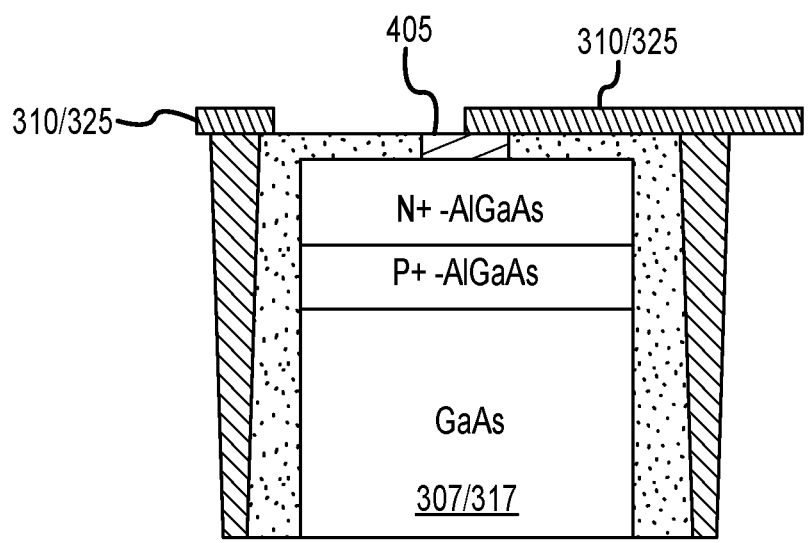
FIG. 4 depicts an example of a light emitter portion according to at least one example embodiment.

FIG. 4 depicts an example of a light emitter portion 313/323 according to at least one example embodiment. FIG. 4 illustrates how an N+ side of light emitter portions 313/323 is connected to an electrode 405. The electrode 405 may be comprised of a different material than the shields 310/325. For example, the electrode 405 may include AuGe and provide electrical connectivity between the light emitter portion 307/317 and metal contacts of the package.

Figure 5A:
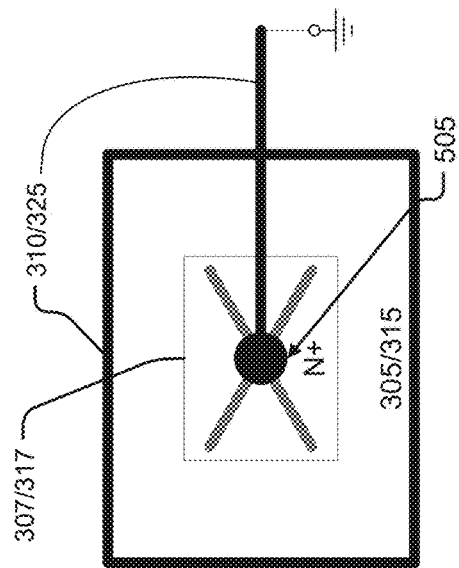
FIGS. 5A-5C illustrate plan views of example light emitter portions according to at least one example embodiment.
Figure 5B:
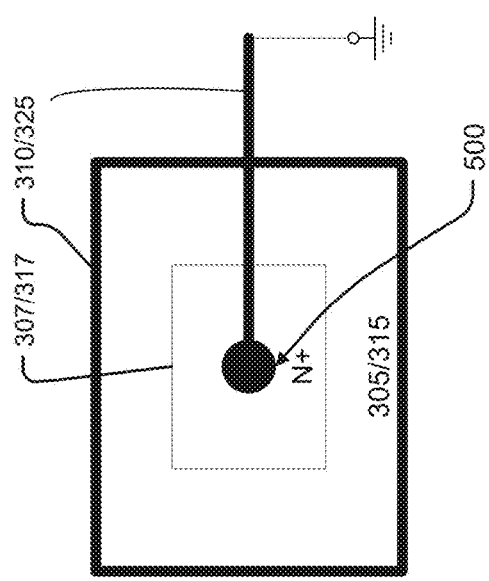
Figure 5C:
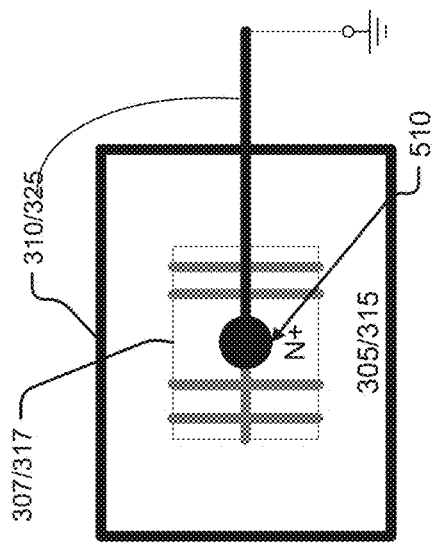

FIGS. 5A-5C illustrate plan views of the first and second integrated circuits 204/208 according to at least one example embodiment. The plan views are taken from a top perspective looking down at the N+ regions of the first and second light emitter portions 307/317.

With reference to FIGS. 1-4, FIGS. 5A-5C show examples of how the first and second shields 310/325 surround all sides the first and second light emitter portions 307/317 in a plan view. That is, the first shield 310 surrounds the first light emitter portion 307 in the plan view and the second shield 325 surrounds the second light emitter portion 317 in the plan view.

As shown in FIGS. 5A-5C, the first light emitter portion 307 and the second light emitter portion 317 each include a trace pattern 500/505/510 on and in electrical connection with a respective N-type material (e.g., N+ region) of the first light emitter portion 307 and the second light emitter portion 317. This may lower the resistance of the N-type material thereby enhancing common mode performance of at least one of the first integrated circuit 204 and the second integrated circuit 208. The trace patterns 500/505/510 can be considered a portion of the shields 310/325 that faces the first and second light-sensitive areas 323/313 and that is sandwiched between the N-type material of each light emitter portion and the isolation material 112.

FIG. 5A illustrates first example trace pattern 500 that includes a circular portion in electrical contact with a respective N+ region of light emitter portions 307/317, and a horizontal linear portion in electrical contact with the circular portion and a respective one of the shields 310/325.

FIG. 5B illustrates a second example trace pattern 505 that includes a circular portion and an X-shaped portion in electrical contact with a respective N+ region of light emitter portions 307/317, and a horizontal linear portion in electrical contact with the circular, X-type portion and a respective one of the shields 310/325.

FIG. 5C illustrates a third example trace pattern 510 that includes a circular portion and vertical linear portions in electrical contact with a respective N+ region of light emitter portions 307/317, and a horizontal linear portion in electrical contact with the circular portion and the vertical linear portions and a respective one of the shields 310/325.

The trace patterns 500/505/510 may be formed to cover a desired amount of surface area of the N+ region. Here, the trace patterns 505/510 cover more surface area of the N+ region than the trace pattern 500. Although the trace patterns 505/510 may block more incoming light from the light emitter portions 307/317 than trace pattern 500, trace patterns 505/510 may reduce noise compared to trace pattern 500. FIGS. 5A and 5B illustrate an example where the trace patterns 500/505/510 comprise the same material as the shields 310/325 (e.g., Al), but example embodiments are not limited thereto. Indeed, the shapes, dimensions, and material of the trace patterns 500/505/510 may vary according to design preferences.

In view of FIGS. 5A-5C it may be said that the shields 310/325 comprise at least one metal strip. As shown, a surface of the light emitter portions 307/317 facing the photodetectors 313/323 comprise an outer perimeter, where the at least one metal strip is disposed over the outer perimeter. For example, the at least one metal strip forms a closed loop around the outer perimeter of the surface of the light emitting portions 307/317 that face the photodetectors 323/313.

Figure 6:
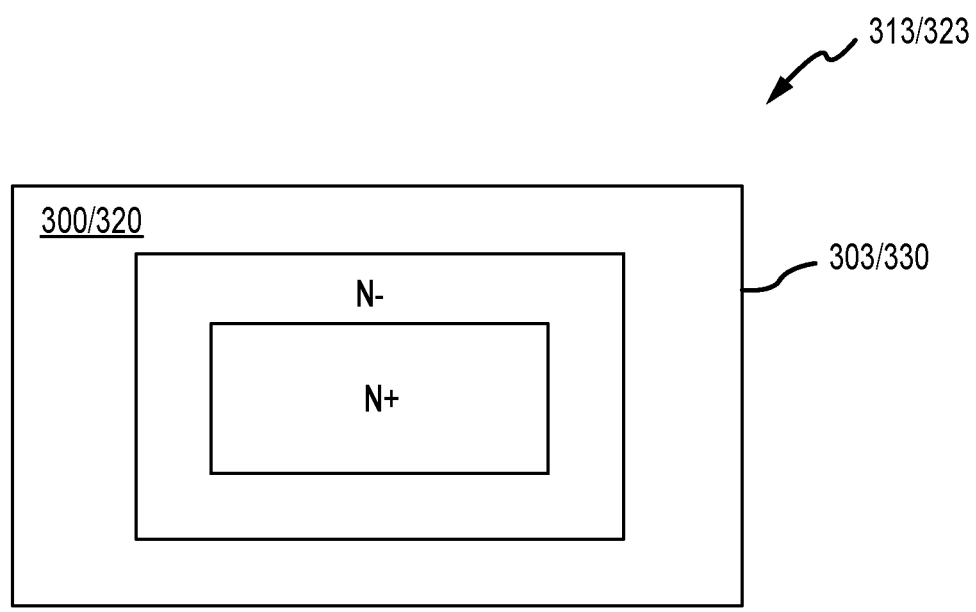
FIG. 6 illustrates a plan view of an example light-sensitive area according to at least one example embodiment.

FIG. 6 illustrates a plan view of the first and second integrated circuits 204/208 according to at least one example embodiment. The plan view is taken from a top perspective looking down onto light sensitive areas 313/323. Thus, parts of substrates 300/320 are shown as surrounding respective N− and N+ regions of the light sensitive areas 313/323. Similar to the shields 310/325 in FIGS. 5A-5C, the shields 303/330 are formed of at least one metal strip around an outer perimeter of the light sensitive areas 313/323. The at least one metal strip forms a closed loop around the outer perimeter.

FIGS. 7-10 illustrate various configurations of the isolation system 100 in FIG. 1 according to example embodiments. Accordingly, FIGS. 7-10 are discussed with reference to FIGS. 1-6. FIGS. 7-10 further show example locations and connections for connecting the top metal and the Faraday shield to a ground voltage or common voltage. In FIGS. 7-10, it should be appreciated that the top metal and Faraday shield may correspond to shields 303/310/325/330 from FIGS. 3-6. Thus, the example locations and connections shown in FIGS. 7-10 are applicable to the structure of FIG. 3. Similar to the shields from FIG. 3, the top metal and the Faraday shield may be comprised of a conductive material, such as Al, Cu, and/or the like.

FIG. 7 illustrates an example arrangement of the system from FIG. 1 as system 100A. In particular, FIG. 7 illustrates an example of stacking the first and second ICs 204/208 and the isolation material 112 on a substrate that includes the first and second circuits 104/108. The Faraday shield and the top metal are grounded or connected to a common voltage via wire bondings (or bonds) 705/710.

As shown in FIG. 7, the first integrated circuit 204 and the second integrated circuit 208 are offset from one another such that the wire bonding 705 is connectable to the Faraday shield at a location on the first integrated circuit 204 that is adjacent to the second integrated circuit 208. FIG. 7 further illustrates that wire bonding 710 is connected to a pad portion on the second IC 208, which is in turn connected to the top metal by a conductive copper via.

FIG. 8 illustrates another example arrangement of the system from FIG. 1 as system 100B. In particular, FIG. 8 illustrates an example of sandwiching the first and second ICs 204/208 and the isolation material 112 between the first circuit 104 and the second circuit 108. In this case, the second IC 208 and the second circuit 108 are bonded to one another via conductive bumps 805. As shown, the conductive bumps 805 are grounded or connected to a first common voltage. As shown, the conductive bumps 805 are connected to respective pads on the second IC 208, which are in turn connected to copper vias that lead to the top metal.

As in FIG. 7, the first IC 204 and the second IC 208 are offset so that the first IC 204 includes a wire bonding 810 connected to the Faraday shield. The wire bonding 810 is grounded or connected to a second common voltage in a manner similar to or the same as in FIG. 7. The first and second common voltage can be the same or different.

FIG. 9 illustrates an example arrangement of the system from FIG. 1 as system 100C. In particular, FIG. 9 illustrates an example of stacking the first and second ICs 204/208 and the isolation material 112 on a substrate that includes the first and second circuits 104/108.

The second IC 208 includes two pads and wire bondings 905 that ground the top metal through two copper vias. The first IC 204 is connected to the substrate with the first and second circuits 104/108 via conductive bumps 910, which ground the Faraday shield through respective pads and copper vias. Unlike FIGS. 7 and 8, the first and second ICs 204/208 of FIG. 9 are not offset, but aligned with one another.

Figure 10:
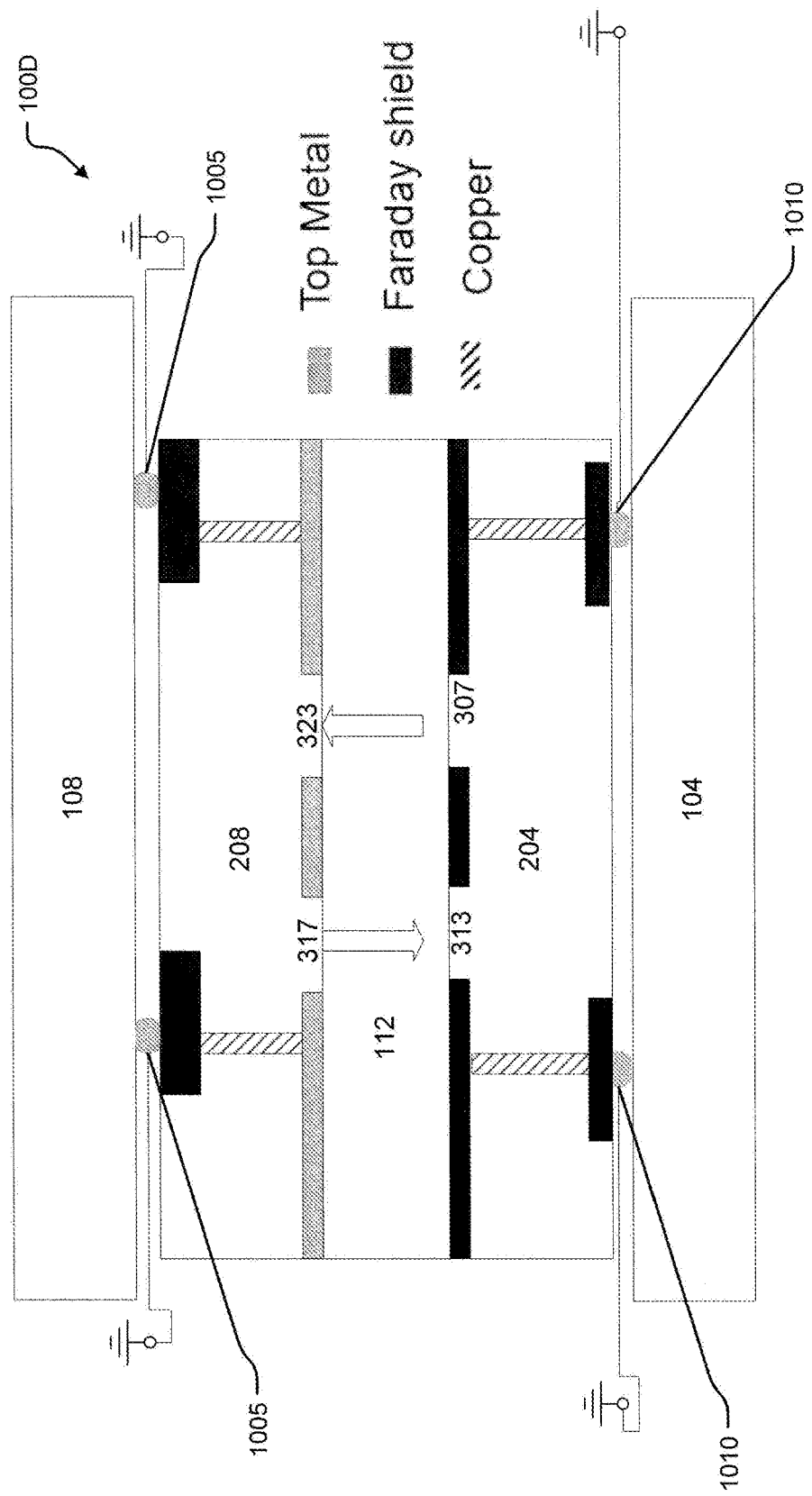
FIG. 10 illustrates another example arrangement of the system in FIG. 1 according to at least one example embodiment.

FIG. 10 illustrates another example arrangement of the system from FIG. 1 as system 100D. In particular, FIG. 10 illustrates an example of sandwiching the first and second ICs 204/208 and the isolation material 112 between the first circuit 104 and the second circuit 108. In this case, the second IC 208 and the second circuit 108 are bonded to one another via conductive bumps 1005. As shown, the conductive bumps 1005 are grounded or connected to a common voltage, and the conductive bumps 1005 are connected to respective pads on the second IC 208, which are in turn connected to copper vias that lead to the top metal. The first IC 204 and the second IC 208 are aligned with one another.

The first IC 204 is bonded to the first circuit 104 using conductive bumps 1010. The conductive bumps 1010 are grounded or connected to a common voltage and ground the Faraday shield through respective pads and copper vias.

With reference to FIGS. 7-10, it should be understood that fewer or additional wire bondings/vias/conductive bumps may be included according to design preferences. It should be understood that the conductive bumps may comprise solder or other suitable conductive/bonding material. Further, the wire bondings/conductive bumps in FIGS. 7-10 may connect to one or more ground terminals or common voltage terminals on the first and/or second circuits 104/108. Alternatively, the wire bondings/conductive bumps are grounded or connected to a common voltage that is exterior to the first and second circuits 104/108.

In view of FIGS. 1-10, it should be appreciated that the first integrated circuit 204 and the second integrated circuit 208 have substantially identical structures. For example, the second integrated circuit 208 is the same as the first integrated circuit 204 except flipped upside-down so that the light emitter portions 310/317 and light sensitive areas 323/313 align with one another in a vertical direction.

In view of FIGS. 1-10, when the shields/top metal/Faraday shield are grounded as described above, respective Faraday cages are formed around the first and second light emitter portions 307/317 and the first and second light-sensitive areas 313/323 that shield the light emitter portions 307/317 and the light-sensitive areas 313/323 from electromagnetic radiation (e.g., external radiation caused by other components of the system).

In view of FIGS. 1-10, it may be said that the first integrated circuit 204 comprises a first substrate having a first side and a second side opposing the first side. The first light emitter portion 307 and the second light sensitive area 313 are disposed on the first side of the first substrate while the second side of the first substrate is disposed on an external surface (e.g., one or more of circuits 204/208).

Further, the second integrated circuit 208 comprises a second substrate having a first side and a second side opposing the first side, where the second light emitter portion 317 and the first light sensitive-area 323 are disposed on the second side of the second substrate that faces the first side of the first integrated circuit 204. Further still, the first integrated circuit 204 comprises a top surface adjacent to the isolation layer 112, and the first and second integrated circuits 204/208 comprise edges that are offset from each other such that a portion of the top surface of the first integrated circuit 204 is exposed.

At least the first integrated circuit 204 comprises at least one contact pad disposed on the portion of the top surface of the first integrated circuit 204 for receiving a first wire bond, and wherein the first wire bond is distanced away from the isolation layer 112.

The first integrated circuit 204 comprises at least one electrically conductive structure (e.g., a via) configured to electrically connect a circuit disposed on a top surface of the first integrated circuit 204 to at least one contact pad (or pad) disposed on a bottom surface of the first integrated circuit 204. The at least one contact pad is configured to receive a solder ball (or conductive bump).

The second integrated circuit 208 comprises a bottom surface adjacent to the isolation layer 112 and a top surface that is opposing the bottom surface, and the second integrated circuit 208 comprises at least one contact pad disposed on the top surface for receiving at least one of a wire bond and a solder ball (or conductive bump).

As can be appreciated, by utilizing the devices and methods as depicted and described herein, an isolation device is realized with a relatively reduced package size and/or footprint. For example, LED structures and light-sensitive areas are formed adjacent to one another on different ICs, which reduces the overall real estate of the isolation device. Light emitting structures in related art optocouplers may be adversely affected by common mode noise. However, example embodiments introduce concepts of grounded metal portions connected to N-regions of LED structures to create a Faraday shield that protects all sides of the LED structures. Furthermore, example embodiments introduce concepts to ground metal portions that surround light sensitive areas to create a Faraday shield that protects all sides of the light sensitive areas.

As can be appreciated, any of the isolators or isolation devices depicted and described herein may be implemented as on-chip solutions (e.g., as a single silicon wafer). In at least one example embodiment, the isolators or isolation devices may be implemented in an Integrated Circuit (IC) chip having other circuit elements provided therein. Moreover, the terms isolator and isolation device may be interchangeable terms as used herein. Indeed, any system, system component, or specific device exhibiting features and/or functions of an electrical isolator as well as an optical coupler may be considered either an isolator or isolation device.

Specific details were given in the description to provide a thorough understanding of the embodiments. However, it will be understood by one of ordinary skill in the art that the embodiments may be practiced without these specific details. In other instances, well-known circuits, processes, algorithms, structures, and techniques may be shown without unnecessary detail in order to avoid obscuring example embodiments.

While illustrative embodiments have been described in detail herein, it is to be understood that inventive concepts may be otherwise variously embodied and employed, and that the appended claims are intended to be construed to include such variations, except as limited by the prior art.

What is claimed is:

1. An isolation device comprising:
   a first integrated circuit in electrical communication with first circuitry, wherein the first integrated circuit includes a first light emitter portion configured to emit a first optical signal based on first electrical signals received at the first integrated circuit from the first circuitry;
   a second integrated circuit in electrical communication with second circuitry, wherein the second integrated circuit includes a first light-sensitive area configured to convert the first optical signal into second electrical signals for communication to the second circuitry;
   an isolation material between the first integrated circuit and the second integrated circuit to electrically isolate the first integrated circuit from the second integrated circuit and to pass the first optical signal from the first light emitter portion to the first light-sensitive area; and
   a first shield to shield the first light emitter portion from electromagnetic radiation.

2. The isolation device of claim 1, wherein the first circuitry and the first integrated circuit are connected to a first ground or a first common voltage and wherein the second circuitry and the second integrated circuit are connected to a second ground or a second common voltage.

3. The isolation device of claim 1, further comprising a leadframe or printed circuit board that supports both the first integrated circuit and the second integrated circuit.

4. The isolation device of claim 1, wherein an N-type material of the first light emitter portion is closer to the first light-sensitive area than a P-type material of the first light emitter portion.

5. The isolation device of claim 4, wherein a portion of the first shield that faces the first light-sensitive area is sandwiched between the N-type material and the isolation material.

6. The isolation device of claim 1, wherein a ratio of thicknesses of the first integrated circuit and the second integrated circuit to a thickness of the isolation material is between about 4:1 and about 6:1.

7. The isolation device of claim 1, wherein the first integrated circuit further comprises a second light-sensitive area and wherein the second integrated circuit further comprises a second light emitter portion.

8. The isolation device of claim 7, wherein the first light emitter portion and the second light emitter portion each include a trace pattern on and in electrical connection with a respective N-type material of the first light emitter portion and the second light emitter portion thereby enhancing common mode performance of at least one of the first integrated circuit and the second integrated circuit.

9. The isolation device of claim 7, wherein the first communication channel carries data via the first optical signal from the first light emitter portion to the first light-sensitive area and wherein the second communication channel carries data via a second optical signal from the second light emitter portion to the second light-sensitive area.

10. The isolation device of claim 1, wherein the first shield comprises at least one metal strip around an outer perimeter of the first light emitter portion.

11. The isolation device of claim 7, further comprising a second shield to shield the second light emitter portion from electromagnetic radiation.

12. The isolation device of claim 11, wherein the first light emitter portion and the second light-sensitive area are adjacent to one another in the first integrated circuit such that a portion of the first shield is between the first light emitter portion and the second light-sensitive area, and wherein the first light-sensitive area and the second light emitter portion are adjacent to one another in the second integrated circuit such that a portion of the second shield is between the first light-sensitive area and the second light emitter portion.

13. The isolation device of claim 11, wherein the first shield is grounded thereby establishing a Faraday shield around the first light emitter portion and wherein the second shield is grounded thereby establishing a Faraday shield around the second light emitter portion.

14. The isolation device of claim 11, wherein the first shield surrounds the first light emitter portion in a plan view and the second shield surrounds the second light emitter portion in the plan view.

15. The isolation device of claim 11, wherein at least the first shield is grounded via a wire bonding, and wherein the first integrated circuit and the second integrated circuit are offset from one another such that the wire bonding for the first shield is connectable to the first shield at a location that is adjacent to the second integrated circuit.

16. The isolation device of claim 7, further comprising:
a third shield to shield the first light sensitive-area from electromagnetic radiation; and
a fourth shield to shield the second light sensitive-area from electromagnetic radiation,
wherein the first light emitter portion and the second light-sensitive area are adjacent to one another in the first integrated circuit such that a portion of the first shield and a portion of the third shield are between the first light emitter portion and the second light-sensitive area, and wherein the first light-sensitive area and the second light emitter portion are adjacent to one another in the second integrated circuit such that a portion of the second shield and a portion of the fourth shield are between the first light-sensitive area and the second light emitter portion.

17. The isolation device of claim 11, wherein the first shield and the second shield are grounded via solder bumps.

18. The isolation device of claim 17, wherein the solder bumps comprise a first solder bump electrically connected to the first shield at a portion of the first shield that extends through the first integrated circuit, and a second solder bump electrically connected to the second shield at a portion of the second shield that extends through the second integrated circuit.

19. An isolation device comprising:
a first integrated circuit in electrical communication with first circuitry, wherein the first integrated circuit includes a first light emitter configured to emit a first optical signal based on first electrical signals received at the first integrated circuit from the first circuitry;
a second integrated circuit in electrical communication with second circuitry, wherein the second integrated circuit includes a first light sensor configured to convert the first optical signal into second electrical signals for communication to the second circuitry;
an isolation material between the first integrated circuit and the second integrated circuit to electrically isolate the first integrated circuit from the second integrated circuit and to pass the first optical signal from the first light emitter to the first light sensor; and
a shield at least partially embedded in the first integrated circuit to shield the first light emitter from electromagnetic radiation.

20. An isolation device, comprising:
a first integrated circuit in electrical communication with first circuitry, wherein the first integrated circuit includes a first light emitter portion configured to emit a first optical signal based on first electrical signals received at the first integrated circuit from the first circuitry;
a second integrated circuit in electrical communication with second circuitry, wherein the second integrated circuit includes a first light-sensitive area configured to convert the first optical signal into second electrical signals for communication to the second circuitry;
an isolation material between the first integrated circuit and the second integrated circuit to electrically isolate the first integrated circuit from the second integrated circuit and to pass the first optical signal from the first light emitter portion to the first light-sensitive area;
a first shield to shield the first light emitter portion from electromagnetic radiation; and
a second shield to shield the first light-sensitive area from electromagnetic radiation.

* * * * *